United States Patent
Galster et al.

[11] Patent Number: 5,869,358
[45] Date of Patent: Feb. 9, 1999

[54] METHOD FOR THE PRODUCTION OF A GATE TURN-OFF THYRISTOR HAVING AN ANODE-SIDE STOP LAYER AND A TRANSPARENT ANODE EMITTER

[75] Inventors: Norbert Galster, Albbruck, Germany; Sven Klaka, Nussbaumen; André Weber, Olten, both of Switzerland

[73] Assignee: Asea Brown Boveri AG, Baden, Switzerland

[21] Appl. No.: 923,542

[22] Filed: Sep. 4, 1997

[30] Foreign Application Priority Data

Dec. 2, 1996 [DE] Germany ............... 196 49 800.7

[51] Int. Cl.$^6$ .................................. H01L 21/332
[52] U.S. Cl. ........................................... 438/133
[58] Field of Search ..................... 438/133, 134, 438/135, 136, 137, 138, 139, 140

[56] References Cited

U.S. PATENT DOCUMENTS

| | | | |
|---|---|---|---|
| 4,056,408 | 11/1977 | Bartko et al. | 438/139 |
| 4,278,475 | 7/1981 | Bartko et al. | 257/155 |
| 4,311,534 | 1/1982 | Bartko et al. | 438/139 |
| 4,987,087 | 1/1991 | Voss | 438/139 |
| 5,710,445 | 6/1995 | Bauer et al. | 257/147 |

FOREIGN PATENT DOCUMENTS

| | | |
|---|---|---|
| 0 621 640 | 10/1994 | European Pat. Off. . |
| 0 651 445 | 5/1995 | European Pat. Off. . |
| 0 700 095 | 3/1996 | European Pat. Off. . |
| 0 717 447 | 6/1996 | European Pat. Off. . |
| 43 13170 | 10/1994 | Germany . |
| 44 31 294 | 3/1996 | Germany . |
| WO97/02603 | 6/1996 | WIPO . |

OTHER PUBLICATIONS

A. Hallén, et al., "Multiple Proton Energy Irradiation of Improved GTO Thyristors", Solid–State Electonics, vol. 36, No. 2, 1993 pp. 133–141.

*Primary Examiner*—Charles Bowers
*Assistant Examiner*—Craig Thompson
*Attorney, Agent, or Firm*—Oblon, Spivak, McClelland, Maier & Neustadt, P.C.

[57] ABSTRACT

A two-stage method is proposed for producing a highly transparent anode emitter (2) in a GTO (1). In a first step, an anode emitter (2) is indiffused whose thickness is greater than 0.5 $\mu$m and whose doping concentration is greater than $10^{17}$ cm$^{-3}$. In a second step, the emitter efficiency of the anode emitter (2) is subsequently reduced to a desired degree by local carrier life setting.

5 Claims, 1 Drawing Sheet

METHOD FOR THE PRODUCTION OF A GATE TURN-OFF THYRISTOR HAVING AN ANODE-SIDE STOP LAYER AND A TRANSPARENT ANODE EMITTER

BACKGROUND OF THE INVENTION

1. Field of the Invention

The invention is concerned with the field of semiconductor electronics. It is based on a method for the production of a gate turn-off thyristor having an anode-side stop layer and a transparent anode emitter in accordance with the preamble of the first claim.

2. Discussion of Background

EP 0 621 640 A1 has already described such a method and a gate turn-off thyristor (GTO) produced thereby. A transparent anode emitter is understood to mean an anode-side emitter layer which is configured in such a way that a significant proportion of the total current leaves the anode metallization layer of the component as an electron current. This electron current, which is specified in % of the total current, is referred to as the emitter transparency. Anode emitters having a transparency of 50% or more are technologically important. A transparent emitter of the generic type is obtained, for example, by selecting a layer depth of 1.2 $\mu$m and indiffusing a doping concentration of $10^{18}$ cm$^{-3}$. Further transparent anode emitters are disclosed in the documents EP 0 651 445 A2 and EP 0 700 095 A2.

On account of the good properties of GTOs having a stop layer and a transparent anode emitter, ever more transparent, i.e. thinner and less heavily doped, anode emitters are desired. However, an ever thinner and more weakly doped anode emitter leads to considerable technological difficulties in the production of the metallic contact of the anode electrode with the anode emitter. When the aluminum is deposited on the semiconductor, the silicon is dissolved and condenses out again on cooling down. This means that the anode emitter is greatly influenced by the metallization process. Subsequent sintering, as is customary in other GTOs for the purpose of reducing the contact resistance, is virtually impossible.

SUMMARY OF THE INVENTION

Accordingly, one object of the invention is to provide a novel method for the production of a gate turn-off thyristor having an anode-side stop layer and a transparent anode emitter in which the abovementioned problems in the production of the anode metallization layer do not occur.

This object is achieved, in the case of a method of the type mentioned in the introduction, by the features of the first claim.

The core of the invention, then, is that first of all a readily manipulable anode emitter is indiffused, the efficiency of which is reduced only in a second step, by means of carrier life setting. For carrier life setting, the anode emitter is irradiated in particular with protons or helium nuclei. The anode emitter which is initially produced preferably has a thickness in the range from 0.5 $\mu$m to 5 $\mu$m and a doping concentration between $10^{17}$ cm$^{-3}$ and $5 \cdot 10^{18}$ cm$^{-3}$.

Further exemplary embodiments emerge from the corresponding dependent claims.

The advantage of the method according to the invention is that problems during the metallization process are precluded due to the fact that the method for producing the transparent emitter has been divided into two parts. The emitter produced in the first step can be metallized without any difficulty. The high transparency which is desired can then be set in the second step.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
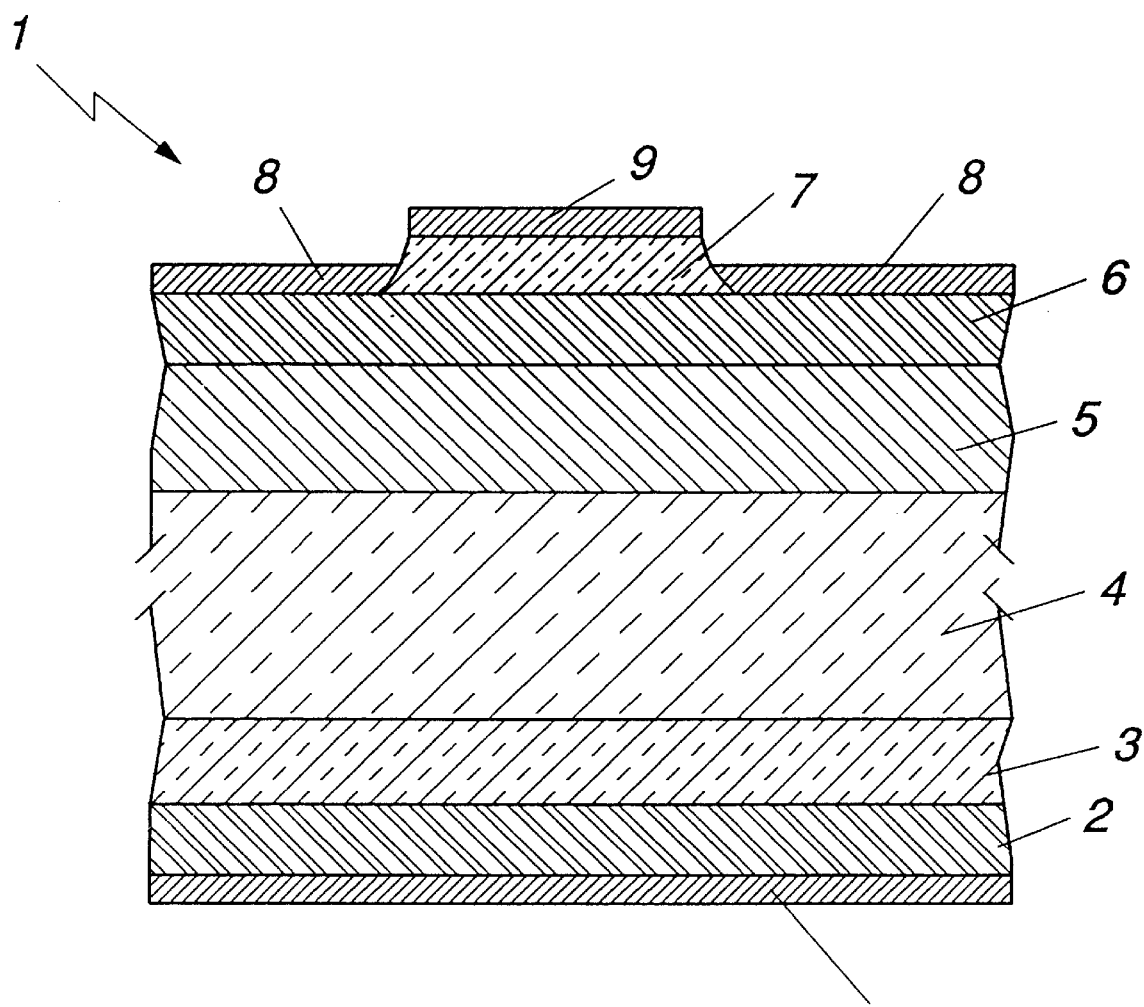
FIG. 1 shows a detail of a GTO whose transparent anode emitter can be produced by the method according to the invention.

The reference numerals used in the drawings and their meanings are summarized in the List of Designations.

DESCRIPTION OF THE PREFERRED EMBODIMENTS

Referring now to the drawings, wherein like reference numerals designate identical or corresponding parts throughout the several views, FIG. 1 shows a detail of a gate turn-off thyristor or GTO 1 in section. Regions which are hatched by single lines illustrate metallization layers. N-doped regions are hatched by alternately continuous and dashed lines. P-doped regions are hatched by two parallel lines. The closer the hatching, the more highly doped the corresponding region is. The GTO 1 comprises a number of differently doped semiconductor layers: 2 designates a preferably p-doped anode emitter. This is followed by an n-doped stop layer 3 and a more weakly n-doped n-type base 4. 5 designates a p-type base, which is adjoined by a somewhat more highly p-doped gate region 6. Finally, 7 designates a cathode emitter or cathode finger. The cathode emitter 7 can be designed such that it is elevated, as illustrated, or else indiffused.

The structure which has just been explained corresponds to that of a customary GTO. It is not necessary at this point to give a specific explanation of the manner in which it functions and/or is produced, since this is adequately disclosed in the prior art mentioned in the introduction. What is essential for the invention is the method for the production of the anode emitter 2. With regard to GTOs which are as fast as possible and have as few losses as possible, an emitter 2 which is as transparent as possible would be desirable in connection with the stop layer 3. That is to say said emitter should have the smallest possible thickness and be very weakly doped. As mentioned in the introduction, however, this leads to problems when the metallization layer 10 is applied to the anode emitter 2.

These problems can be solved by the inventive method for the production of the transparent emitter in that, in a first step, the transparent emitter 2 is made thicker and doped more heavily than desired, and the required transparency is realized in a second step, by means of carrier life setting. The carrier life setting is in this case preferably carried out by means of irradiation with protons or helium nuclei.

The anode emitter 2 can be produced, for example, according to the following reproducible conditions:

First of all, the anode emitter 2 is indiffused by means of implantation of boron for 10 to 15 hours at 1000° to 1050° C. The resultant doping profile has a maximum concentration of approximately $5 \cdot 10^{17}$ cm$^{-3}$ and a penetration depth in the range from 1 $\mu$m to 3 $\mu$m. Sintering of the subsequently applied anode metallization layer 10 is still possible with such a layer. The required weak efficiency of the anode emitter, i.e. the high transparency, is implemented in a second step, by carrier life setting, prior to the application of the metallization layer 10. For this purpose, it is preferred to apply an irradiation with protons or helium down to a depth which is greater than the abovementioned anode emitter penetration depth but less than the penetration depth of the stop layer 3 (for example 50 μm). Suitable radiation doses are in the range from $10^{10}$ to $10^{12}$ particles per $cm^2$.

The two-stage production method according to the invention therefore makes it possible to realize a transparent anode emitter which, despite its high transparency, can be metallized without any difficulty. Consequently, the resulting GTO can be optimized further in respect of on-state losses and switching behavior, without other desirable properties being impaired.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the Unites States is:

1. A method for the production of a gate turn-off thyristor having an anode-side stop layer and a transparent anode emitter comprising the steps of:

producing an anode emitter with a thickness greater than 0.5 μm and less than 5 μm and with a doping concentration greater than $10^{17}$ $cm^{-3}$ and less than $5·10^{18}$ $cm^{-3}$, and setting the emitter efficiency of the anode emitter by nuclear irradiation of the anode emitter before an anode metallization layer is applied to the anode emitter.

2. The method as claimed in claim 1, wherein the nuclear irradiation of the anode emitter comprises protons irradiation.

3. The method as claimed in claim 2, wherein the nuclear irradiation has a radiation dose between $10^{10}$ $cm^{-2}$ and $10^{12}$ $cm^{-2}$.

4. The method as claimed in claim 1, wherein the nuclear irradiation of the anode emitter comprises helium nuclei irradiation.

5. The method as claimed in claim 4, wherein the nuclear irradiation has a radiation dose between $10^{10}$ $cm^{-2}$ and $10^{12}$ $cm^{-2}$.

* * * * *